United States Patent
Goudarzi et al.

(10) Patent No.: US 7,413,110 B2
(45) Date of Patent: Aug. 19, 2008

(54) METHOD FOR REDUCING STRESS BETWEEN SUBSTRATES OF DIFFERING MATERIALS

(75) Inventors: Vahid Goudarzi, Coral Springs, FL (US); Julio A. Abdala, Fort Lauderdale, FL (US); Gulten Goudarzi, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 220 days.

(21) Appl. No.: 11/059,596

(22) Filed: Feb. 16, 2005

(65) Prior Publication Data

US 2006/0180639 A1    Aug. 17, 2006

(51) Int. Cl.
*B23K 31/02* (2006.01)
(52) U.S. Cl. .................... 228/226; 228/229
(58) Field of Classification Search ............. 228/226, 228/225, 179.1, 180.1, 245, 227, 229, 180.21; 257/778; 438/612, 613, 615, 617; 420/577
See application file for complete search history.

(56) References Cited

U.S. PATENT DOCUMENTS

| | | | |
|---|---|---|---|
| 5,130,779 A | | 7/1992 | Agarwala et al. |
| 5,346,118 A | * | 9/1994 | Degani et al. ........... 228/180.22 |
| 5,414,303 A | * | 5/1995 | Gonya et al. ............... 257/772 |
| 5,634,268 A | | 6/1997 | Dalal et al. |
| 5,854,514 A | | 12/1998 | Roldan et al. |
| 6,020,561 A | | 2/2000 | Ishida et al. |
| 6,077,725 A | | 6/2000 | Degani et al. |
| 6,150,717 A | | 11/2000 | Wood et al. |
| 6,281,041 B1 | | 8/2001 | Ho et al. |
| 6,399,896 B1 | * | 6/2002 | Downes et al. ............. 174/260 |
| 6,433,425 B1 | * | 8/2002 | Sarkhel ..................... 257/737 |
| 6,507,113 B1 | | 1/2003 | Fillion et al. |
| 6,608,389 B1 | | 8/2003 | Hashimoto |
| 6,610,559 B2 | | 8/2003 | Wang et al. |
| 6,644,536 B2 | | 11/2003 | Ratificar et al. |
| 6,767,819 B2 | * | 7/2004 | Lutz ........................... 438/614 |
| 6,774,493 B2 | * | 8/2004 | Capote et al. .............. 257/778 |
| 6,784,086 B2 | * | 8/2004 | Ray et al. ................... 438/612 |
| 2002/0162880 A1 | | 11/2002 | Jackson et al. |

* cited by examiner

*Primary Examiner*—Kevin P Kerns
*Assistant Examiner*—Michael Aboagye

(57) ABSTRACT

A method (80) of reducing stress between substrates of differing materials includes the steps of applying (82) solder (16) on a first substrate (14), reflowing (84) the solder on the first substrate to form a cladded substrate (30), applying (85) a medium such as flux or solder on a second substrate (42) having a substantially different coefficient of thermal expansion than the first substrate, placing (86) the cladded substrate on the second substrate, and reflowing (88) the cladded substrate and the second substrate such that thermal stress caused by the substantially different coefficient of thermal expansion between the first and second substrates is limited to when a temperature approximately reaches below a solidus temperature of the solder on the first substrate.

16 Claims, 3 Drawing Sheets

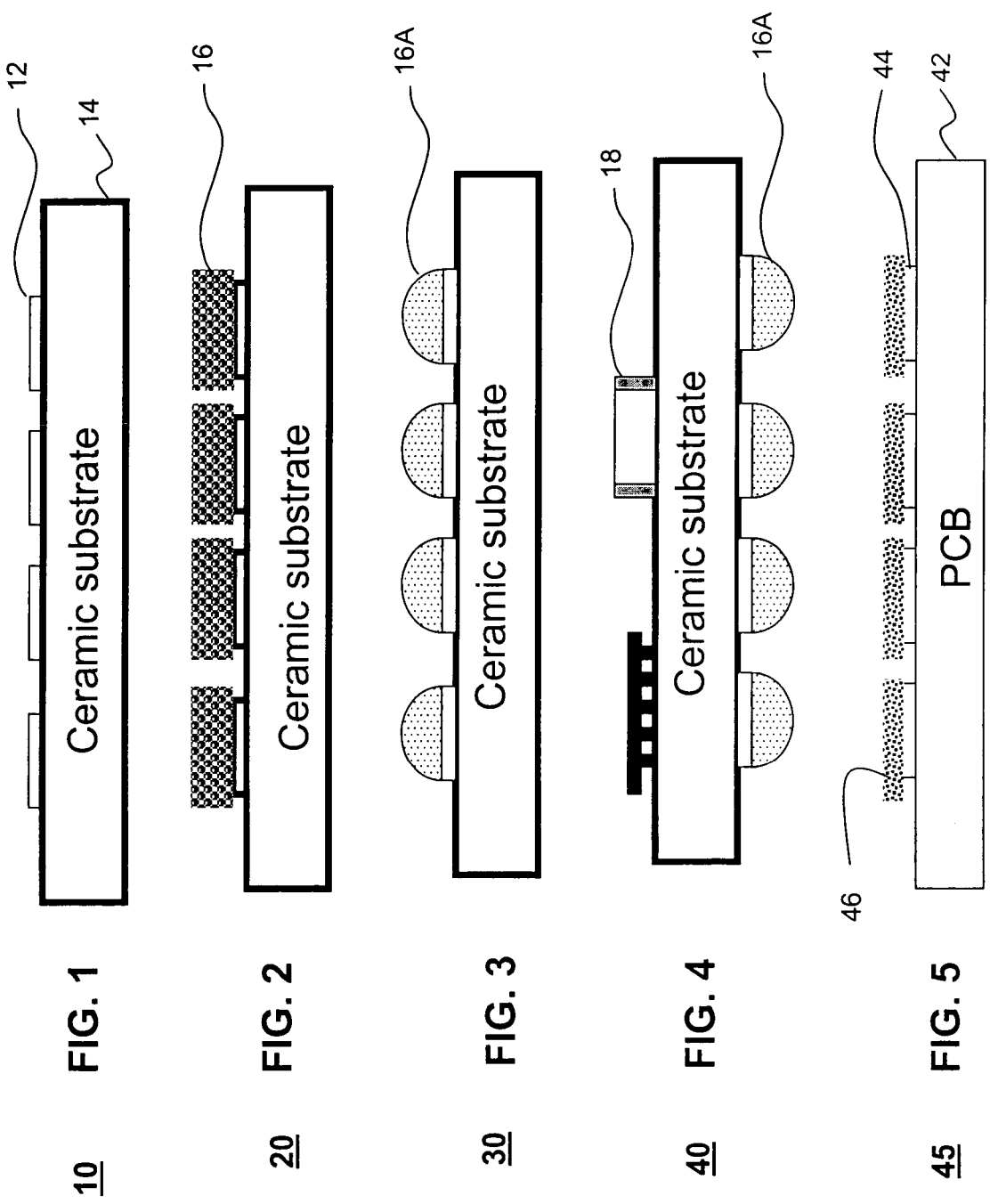

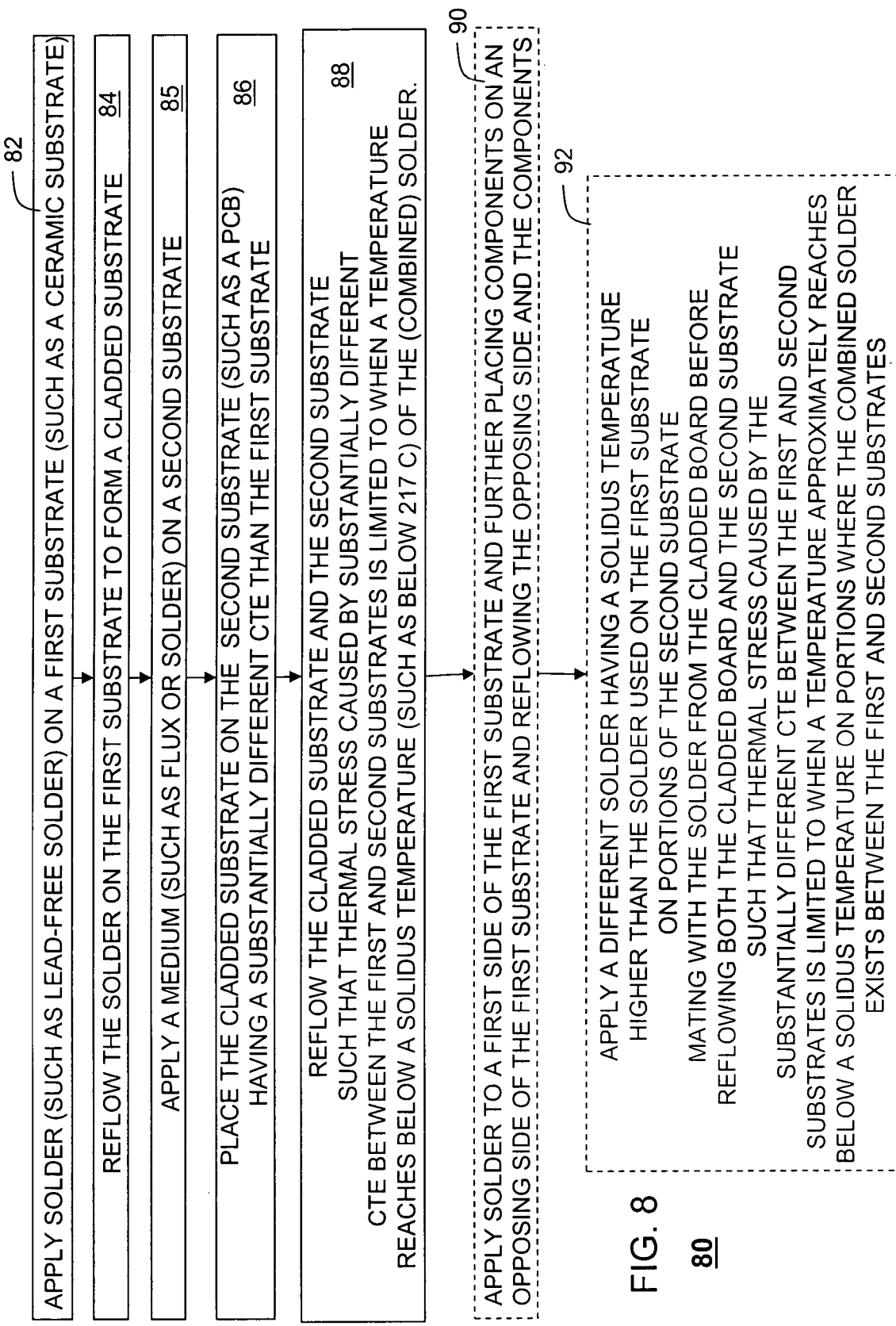

METHOD FOR REDUCING STRESS BETWEEN SUBSTRATES OF DIFFERING MATERIALS

CROSS-REFERENCE TO RELATED APPLICATIONS

Not applicable.

FIELD OF THE INVENTION

This invention relates in general to the application of solder between substrates, and more particularly to a package or assembly and a manufacture thereof using different substrates that is less susceptible to thermal stress.

BACKGROUND OF THE INVENTION

Soldered modules that include substrates of differing substrate materials are subject to thermal stress due to differing coefficients of thermal expansion (CTE) between the respective substrates. For example, due to CTE mismatch, cracks in the solder and possibly elsewhere (the substrates themselves) occur during the reflow process when attempting to solder a ceramic substrate to a printed circuit board (PCB) material such as FR4.

Differing CTEs among substrates is also commonly known as CTE mismatch. A typical PCB material can have a CTE of 15 PPM/Degree C while a Ceramic substrate can have a CTE of 6 PPM/Degree C. Thus, cracks are initiated during the cooling process (of the reflow process) as the solder materials between the PCB and ceramic solidifies while the PCB and ceramic are not fully in a steady state. Note that Pb-free solder paste (95.5% Sn-3.8% Ag-0.7% Cu) solidifies or has a solidus temperature at 217 degree C. while the PCB and the Ceramic are still contracting at different rates as the temperature is reduced. As a result, cracks form in the ceramic and possibly the solder as well. High solidus temperature solder paste (95.5% Sn-3.8% Ag-0.7% Cu) solidifies long before a ceramic and PCB board stop contracting at different rates.

Note, there is a difference between the terms solidus, liquidus, and melting point. The term melting point, as used by metallurgists, usually applies to pure metals that melt at a single temperature. Alloys have very different melting characteristics compared to their pure forms. Most alloys do not have a single melting temperature or melting point, but instead they have a melting range. The upper limit of this range is called the liquidus temperature and the lower limit of this range is called the solidus temperature. Therefore, most metallurgists will say a pure metal has a melting point, while an alloy (brazing filler metal) has a melting range. During heating, solidus is that temperature at which an alloy begins to melt. Between the solidus and liquidus temperatures, the alloy will be a mixture of solid and liquid phases. Just above the solidus temperature, the mixture will be mostly solid with some liquid phases. Just below the liquidus temperature, the mixture will be mostly liquid with some solid phases. Liquidus is the temperature above which an alloy is completely molten. In other words, when an alloy exceeds the liquidus temperature, there are no solid phases present. The alloy is completely melted and flowing. A few special alloy compositions have a specific melting point like that of a pure metal, in other words the solidus and liquidus are the same temperature. Alloys of this type are called "eutectic compositions" and the melting point is known as a eutectic point.

SUMMARY OF THE INVENTION

Embodiments in accordance with the invention illustrate an arrangement and method of forming a module having at least two substrates of differing material that can remain substantially free from cracks during and after a reflow process.

In a first aspect of an embodiment of the present invention, a method of reducing stress between substrates of differing materials includes the steps of applying solder (such as lead-free solder) on a first substrate, reflowing the solder on the first substrate to form a cladded substrate, applying a medium on a second substrate, placing the cladded substrate on the second substrate having a substantially different coefficient of thermal expansion than the first substrate, and reflowing the cladded substrate and the second substrate such that thermal stress caused by the substantially different coefficient of thermal expansion between the first and second substrates is limited to when a temperature approximately reaches below a solidus temperature of the solder used on a first substrate. The lead-free solder can have a solidus temperature below 217 Celsius and can include any number of different lead-free solders such 57% Bi, 42% Sn, 1% Ag having a solidus temperature of 139 degrees C. or 43% Sn, 43% Pb, 14% Bi having a solidus temperature of 144 degrees C. The first substrate can be a ceramic substrate having a coefficient of thermal expansion of 6 PPM/Degree C. for example. The second substrate can be made of a printed circuit board material having a coefficient of thermal expansion of 15 PPM/Degree C. for example. The medium can be a tacking medium such as flux or solder. The medium can be a solder having a solidus temperature higher than the solidus temperature of the solder applied to the first substrate. Optionally, the step of applying solder to the first substrate can include applying solder to a first side of the first substrate and the method can further comprise the step of placing components on an opposing side of the first substrate and reflowing the opposing side and the components. Note, thermal stress caused by the substantially different coefficient of thermal expansion between the first and second substrates is limited to when a temperature approximately reaches below a solidus temperature of a combined solder alloy formed from the solder used on the first substrate and used on the second substrate. Further note, the solidus temperature of the combined solder alloy is primarily governed by the solidus temperature of the solder used on the first substrate.

In a second aspect of an embodiment of the present invention, a method of reducing stress between substrates of differing materials includes the steps of applying solder having a first solidus temperature (such as below 217 Celsius) on a first substrate made of a first material, reflowing the solder and the first substrate to provide a cladded board, applying a medium on a second substrate, placing the cladded board on the second substrate made of a second material having a second coefficient of thermal expansion, and reflowing the cladded board and the second substrate such that thermal stress caused by any mismatch of the first coefficient of thermal expansion with the second coefficient of expansion is limited to when a temperature reaches below the first solidus temperature of the solder on the first substrate. The solder can be lead-free solder having a solidus temperature below 217 Celsius such as 57% Bi, 42% Sn, 1% Ag having a solidus temperature of 139 degrees C. or 43% Sn, 43% Pb, 14% Bi having a solidus temperature of 144 degrees C. The substrate can be a ceramic substrate having a coefficient of thermal expansion of 6 PPM/Degree C. The second material of the second substrate can be made of a printed circuit board material having a coefficient of thermal expansion of 15 PPM/Degree C. for example. The medium can be a solder having a solidus temperature higher than the first solidus temperature of the solder applied to the first substrate such as solder having a solidus temperature at or above 217 Celsius on portions of the second substrate mating with the solder from the cladded board before reflowing the cladded board and the second substrate. In another alternative, the step of applying solder to the first substrate can include applying solder to a first side of the first substrate and the method can further include the step of placing components on an opposing side of the first substrate and reflowing the opposing side and the components.

In a third embodiment, a module can include a first substrate made of a first material, at least a second substrate made of at least a second material having a substantially different coefficient of thermal expansion than a coefficient of thermal expansion for the first substrate, and a low solidus temperature solder between the first substrate and at least the second substrate placed therein during a reflow process such that thermal stress caused by the substantially different coefficient of thermal expansion between the first and second substrates is limited to when a temperature reaches below a solidus temperature of the low solidus temperature solder. The solidus temperature of the low solidus temperature solder can be at or below 144 degrees Celsius. Note, no cracks would exist in the first substrate and at least the second substrate as a result of a reflow process. Further note that the first substrate can be made of a ceramic material and the second substrate can be made of a printed circuit board material. Note, the low solidus temperature solder between the first and second substrate is formed as an alloy from a low melting point solder cladded to the first substrate with a higher solidus temperature solder applied to the second substrate during a reflow process wherein the alloy has a solidus temperature governed primarily by the low solidus temperature solder.

BRIEF DESCRIPTION OF THE DRAWINGS

FIG. 1 illustrates a side cut view of a substrate in accordance with an embodiment of the present invention.

FIG. 2 illustrates a side cut view of the substrate of FIG. 1, further having applied thereon lead-free low melting point solder in accordance with an embodiment of the present invention.

FIG. 3 illustrates a side cut view of the substrate of FIG. 2 after reflowing to provide a cladded board in accordance with an embodiment of the present invention.

FIG. 4 illustrates a side cut view of the cladded board of FIG. 3, further including components on an opposing side of the cladding in accordance with an embodiment of the present invention.

FIG. 5 illustrates a side cut view of a second substrate such as a printed circuit board having a medium applied on areas where the cladded portions of the cladded board of FIG. 4 will mate with solder pads of the second substrate in accordance with another embodiment of the present invention.

FIG. 8 is a flow chart illustrating a method of reducing stress between substrates of differing materials in accordance with an embodiment of the present invention.

DETAILED DESCRIPTION OF THE DRAWINGS

Figure 6:
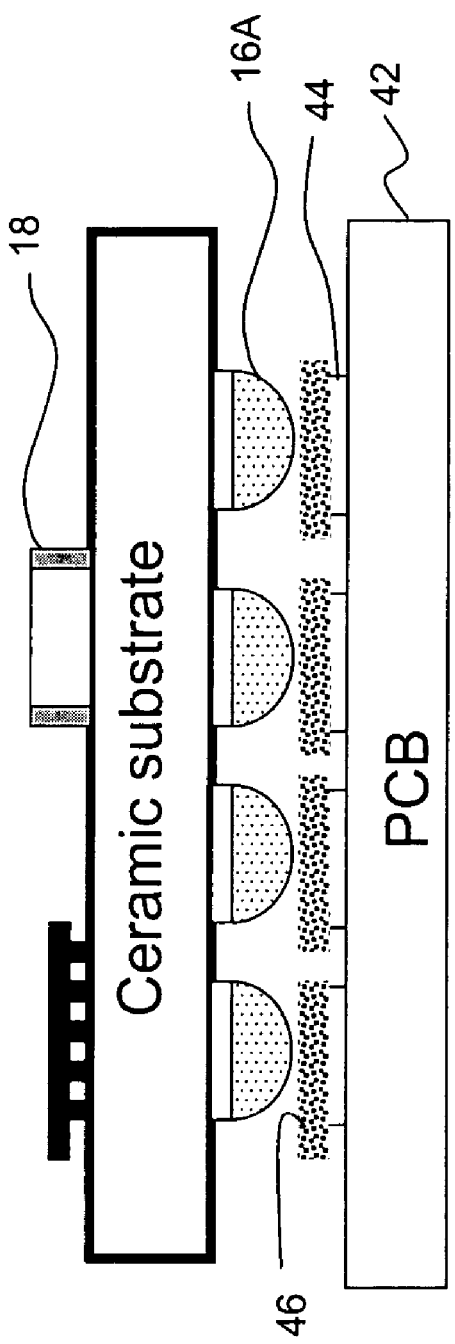
FIG. 6 is a side cut view of a module before reflowing formed by placing the cladded board onto the second substrate in accordance with an embodiment of the present invention.

While the specification concludes with claims defining the features of the invention that are regarded as novel, it is believed that the invention will be better understood from a consideration of the following description in conjunction with the drawing figures, in which like reference numerals are carried forward.

Referring to FIGS. 1-5, a side cut view of a module 50 is shown through several steps in the process of manufacturing the module 50. In FIG. 1, a pre-processed ceramic board 10 can include a ceramic substrate 14 having a plurality of solder pads 12. In FIG. 2, solder 16 can be applied to the plurality of solder pads 12. The solder 16 can be a low melting point solder and can also be lead-free. For example, the solder 16 can be in the form of low melting point paste composed of 58% Bi/42% Sn that is printed onto the solder pads 12. Once the solder 16 is applied, the ceramic board can be placed in a reflow oven to provide a cladded board 30 having cladding 16A. Optionally, as shown in FIG. 4, components 18 can be placed on an opposing side of the cladding 16A. Then the components can be reflowed on the opposing side to form the assembly 40 which is a thermally relieved package. This thermally relieved package is in contrast to existing ceramic packages that do not include cladding (and components on an opposing side) before placement onto another board such as a printed circuit board. The assembly 40 can then be placed (as shown in FIG. 6) on a processed printed circuit board 45 as shown in FIG. 5 which can include a printed circuit board (PCB) 42 having conductive areas including solder pads 44. The processed PCB 45 can further include a medium 46 such as tacking medium on the solder pads 44. The medium 46 can be flux or alternatively it can be a solder. If the medium 46 is solder, it can be applied in a number of ways to the PCB 42 including, but not limited to screen printing. Once the assembly 40 is placed on the processed PCB 45 as shown in FIG. 6 an assembly 50 is formed which can be reflowed such that the cladding 16A forms a combined alloy solder 55 with the medium 46. If the medium 46 is a high solidus temperature solder, the reflow process in accordance with an embodiment herein should cause the cladding 16A and the medium 46 to both reach a liquidus temperature and form the combined alloy solder 55 which would then have a solidus temperature primarily dominated or governed by the lower solidus temperature of the cladding 16A. Again, this is in contrast to existing technology that typically takes an uncladded board and then only prints high melting point (or high solidus temperature) solder between the ceramic substrate and the PCB.

Although the solder discussed above can be of any form (such as preform or paste), the use of solder balls with the appropriate characteristics can also be used. The solder 16 used for cladding the ceramic substrate can for example be low melting point solder bumps, paste or preforms having a composition of 57% Bi, 42% Sn, 1% Ag which can solidify at 139 degrees C. If solder preform or paste is used, the low melting point solder can alternatively be composed of 43% Sn, 43% Pb, 14% Bi which can solidify at 144 degrees C. The medium 46 can be solder that has a higher melting point (or higher solidus temperature) such as lead-free solder bumps, solder paste or solder preform having a composition of 95.5% Sn, 3.8% Ag, and 0.7% Cu. This particular composition solidifies at 217 degrees C. Of course, these solder compositions are merely exemplary and should not be interpreted to limit the scope of the invention in any manner. As noted above, the different applied solder compositions can also come in different forms such as solder balls, solder paste, solder preform or any other known form of solder.

Figure 7:
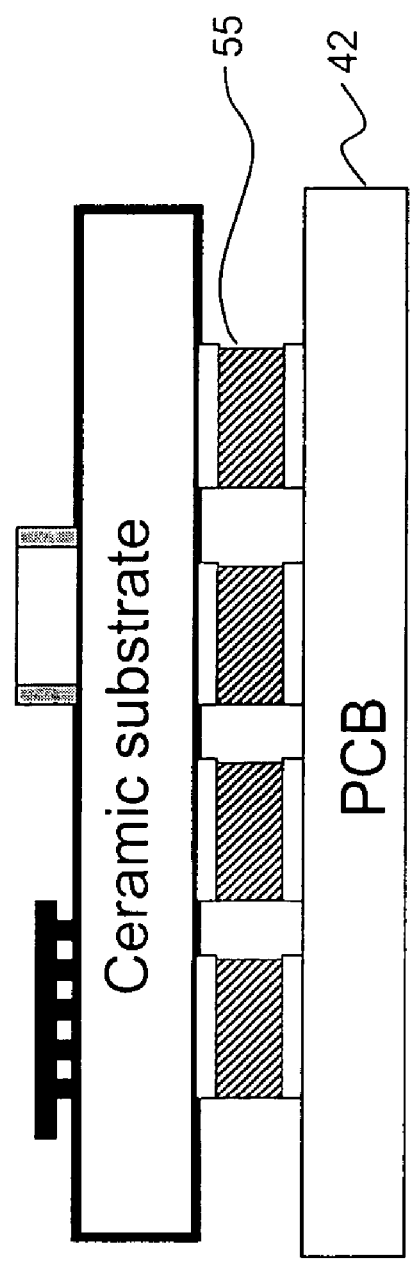
FIG. 7 shows a side cut view the module of FIG. 7 after reflowing in accordance with an embodiment of the present invention.

In the example shown in FIGS. 6 and 7, thermal stress on the module 50 is reduced by applying a lower melting point or solidus temperature solder (16) to a first substrate and reflowing the first substrate to provide a cladded board with cladding 16A. The lower solidus temperature cladding 16A will typically govern or dominate a new solidus temperature of any alloy formed during a reflow process with a solder having a higher solidus temperature. In this manner, there is a reduced range of temperatures where CTE mismatch between substrates exists and cracks in the solder and the substrates (particularly a ceramic substrate) due to the reflow process will be reduced or completely eliminated. By reducing the solidus temperature of the combined solder from 217 degrees C. to 144 degrees C. or 139 degrees C. for example, the stress on the substrates start at a much lower temperature (144 or 139 degrees C.) as the substrates contract during the reflow process. As a result, the stress on the ceramic or other components in the module is significantly reduced. Once, the module 50 is reflowed, a completed package is formed.

Referring to FIG. 8, a flow chart illustrating a method 80 of reducing stress between substrates of differing materials is shown. The method 80 can include the step 82 of applying solder (such as lead-free solder) on a first substrate, reflowing the solder on the first substrate at step 84 to form a cladded substrate, applying a medium such as flux or solder on a second substrate at step 85, and placing the cladded substrate on the second substrate having a substantially different coefficient of thermal expansion than the first substrate at step 86. The method 80 can further include the step 88 of reflowing the cladded substrate and the second substrate such that thermal stress caused by the substantially different coefficient of thermal expansion between the first and second substrates is limited to when a temperature reaches below a solidus temperature of the solder (or combined solder in the case where the medium on the second substrate is solder). Although leaded solder can be used for the cladded substrate in accordance with the embodiments herein, the solder used on the cladded substrate should have a lower solidus temperature than any solder used as the medium for the second substrate. The lead-free solder used for the cladded substrate for example can have a solidus temperature below 217 Celsius and can include any number of different lead-free solders such 57% Bi, 42% Sn, 1% Ag having a solidus temperature of 139 degrees C. or 43% Sn, 43% Pb, 14% Bi having a solidus temperature of 144 degrees C. The first substrate can be a ceramic substrate having a coefficient of thermal expansion of 6 PPM/Degree C. for example. The second substrate can be made of a printed circuit board material such as FR4 having a coefficient of thermal expansion of 15 PPM/Degree C. for example. Optionally, the method 80 can further include the step of applying solder to the first substrate by applying solder at step 90 to a first side of the first substrate and placing components on an opposing side of the first substrate and reflowing the opposing side and the components. The method 80 can further include the step 92 of applying a different solder having a solidus temperature higher than the solidus temperature of the solder used on the first or cladded substrate. For example, if solder having a solidus temperature below 217 Celsius is used on the cladded substrate, then solder at or above 217 Celsius can be used on portions of the second substrate mating with the solder from the cladded board before reflowing the cladded board and the second substrate. In this manner, during the cooling portion of the reflow process, the thermal stress caused by the substantially different coefficient of thermal expansion between the first and second substrates is limited to when a temperature reaches below a solidus temperature of the combined solder on portions where the solder exists between the first and second substrates. The solidus temperature of the combined solder (in alloy form during reflow) will have a solidus temperature dominated or primarily governed by the solidus temperature of the lower solidus temperature solder (or the cladding on the first substrate).

Thus, the embodiments in accordance with the invention solves among other problems, the problem of CTM mismatch when using different substrates in modules. While several embodiments of the invention have been illustrated and described, it should be understood that the embodiments are not so limited. Numerous modifications, changes, variations, substitutions and equivalents will occur to those skilled in the art without departing from the spirit and scope of the present invention as defined by the appended claims.

Additionally, the description above is intended by way of example only and is not intended to limit the present invention in any way, except as set forth in the following claims.

What is claimed is:

1. A method of reducing stress between substrates of differing materials, comprising the steps of:
    applying solder on a first substrate;
    reflowing by melting the solder on the first substrate and allowing the solder and first substrate to cool to form a cladded substrate;
    applying a medium on a second substrate, wherein the medium has a solidus temperature higher than a solidus temperature of the solder applied to the first substrate;
    placing the cladded substrate on the second substrate having a substantially different coefficient of thermal expansion than the first substrate;
    reflowing the cladded substrate and the second substrate to a temperature that melts the solder used on the second substrate;
    enabling the cladded substrate and the second substrate to cool after reflow such that thermal stress caused by the substantially different coefficient of thermal expansion between the first and second substrates is avoided between the solidus temperature of the solder on the second substrate and the solidus temperature of the solder on the first substrate as the cladded substrate and the second substrate cool down immediately after reflow.

2. The method of claim 1, wherein the step of applying solder comprises the step of applying lead-free solder having a solidus temperature below 217 Celsius.

3. The method of claim 1, wherein the step of applying solder comprises the step of applying solder of a composition of 57% Bi, 42% Sn, 1% Ag having a solidus temperature of 139 degrees C. or of a composition of 43% Sn, 43% Pb, 14% Bi having a solidus temperature of 144 degrees C.

4. The method of claim 1, wherein the step of applying solder to the first substrate comprises the step of applying solder to a ceramic substrate having an approximate coefficient of thermal expansion of 6 PPM/Degree C. and wherein the second substrate comprises of a printed circuit board material having an approximate coefficient of thermal expansion of 15 PPM/Degree C.

5. The method of claim 1, wherein the step of applying a medium comprises the step of applying at least one among a flux or a solder having a solidus temperature higher than the solidus temperature of the solder applied to the first substrate.

6. The method of claim 5, wherein the thermal stress caused by the substantially different coefficient of thermal expansion between the first and second substrates is limited to when a temperature approximately reaches below a solidus temperature of a combined solder alloy formed from the solder used on the first substrate and used on the second substrate.

7. The method of claim 1, wherein the method further comprises the step of applying on the second substrate a different solder having a solidus temperature above the solidus temperature of the solder used on the first substrate such that thermal stress caused by the substantially different coefficient of thermal expansion between the first and second substrates is limited to when a temperature reaches below a solidus temperature of a combined solder alloy formed from the solder used on the first substrate and used on second substrates wherein the solidus temperature of the combined solder alloy is primarily governed by the solidus temperature of the solder used on the first substrate.

8. The method of claim 1, wherein the step of applying solder to the first substrate comprises applying solder to a first side of the first substrate and the method further comprises the step of placing components on an opposing side of the first substrate and reflowing the opposing side and the components.

9. A method of reducing stress between substrates of differing materials, comprising the steps of:
applying solder on a first substrate made of a first material and having a first coefficient of thermal expansion, wherein the solder has a first solidus temperature;
reflowing by melting the solder on the first substrate and allowing the solder and first substrate to cool to provide a cladded board;
applying a medium on a second substrate, wherein the medium has a solidus temperature higher than the first solidus temperature of the solder applied to the first substrate;
placing the cladded board on the second substrate made of a second material having a second coefficient of thermal expansion; and
reflowing the cladded board and the second substrate at a temperature that melts the solder used on the second substrate enabling the cladded board and the second substrate to cool after reflow such that thermal stress caused by any mismatch of the first coefficient of thermal expansion with the second coefficient of expansion is avoided between the solidus temperature of the solder on the second substrate and the solidus temperature of the solder on the cladded board as the cladded board and the second substrate cool down immediately after reflow.

10. The method of claim 9, wherein the step of applying solder comprises the step of applying lead-free solder having a solidus temperature below 217 Celsius.

11. The method of claim 9, wherein the step of applying solder comprises the step of applying solder of a composition of 57% Bi, 42% Sn, 1% Ag having a solidus temperature of 139 degrees C. or of a composition of 43% Sn, 43% Pb, 14% Bi having a solidus temperature of 144 degrees C.

12. The method of claim 9, wherein the step of applying solder to the first substrate comprises the step of applying solder to a ceramic substrate.

13. The method of claim 9, wherein the step of applying a medium comprises the step of applying a solder having a solidus temperature higher than the first solidus temperature of the solder applied to the first substrate.

14. The method of claim 9, wherein the second material of the second substrate comprises a printed circuit board material.

15. The method of claim 9, wherein the step of applying a medium further comprises the step of applying solder having a solidus temperature at or above 217 Celsius on at least portions of the second substrate mating with the solder from the cladded board before reflowing the cladded board and the second substrate.

16. The method of claim 9, wherein the step of applying solder to the first substrate comprises applying solder to a first side of the first substrate and the method further comprises the step of placing components on an opposing side of the first substrate and reflowing the opposing side and the components.

* * * * *